(12) United States Patent
Prakash et al.

(10) Patent No.: US 10,457,413 B2
(45) Date of Patent: Oct. 29, 2019

(54) METHODS AND SYSTEMS FOR AIRCRAFT LIGHTNING STRIKE PROTECTION

(71) Applicant: The Boeing Company, Chicago, IL (US)

(72) Inventors: Om Prakash, Bangalore (IN); Kanakasabapathi Subramanian, Tamilnadu (IN); R. Anbarasan, Tamilnadu (IN); S. Meenatchi Sundaram, Tamilnadu (IN)

(73) Assignee: The Boeing Company, Chicago, IL (US)

( * ) Notice: Subject to any disclaimer, the term of this patent is extended or adjusted under 35 U.S.C. 154(b) by 317 days.

(21) Appl. No.: 15/658,656

(22) Filed: Jul. 25, 2017

(65) Prior Publication Data

US 2019/0031368 A1  Jan. 31, 2019

(51) Int. Cl.
*G01R 29/08* (2006.01)
*B64D 45/02* (2006.01)
*G01W 1/16* (2006.01)

(52) U.S. Cl.
CPC ............. *B64D 45/02* (2013.01); *G01R 29/08* (2013.01); *G01W 1/16* (2013.01)

(58) Field of Classification Search
CPC ....... B60C 19/08; B60R 16/06; B60S 1/0818; B60S 1/0833; B64D 45/00; B64D 45/0005; B64D 45/02; F03D 80/30; F21S 8/086; F21S 9/035; G01R 15/144; G01R 29/08; G01R 29/0842; G01R 29/0878; G01R 29/12; G01R 29/14; G01R 31/008; G01W 1/00; G01W 1/08; G01W 1/16; G06F 1/1656; G06F 1/182; H01R 31/065;
(Continued)

(56) References Cited

U.S. PATENT DOCUMENTS 4,328,461 A * 5/1982 Butters ................ G01R 15/144
                                                  324/72
6,362,574 B1 * 3/2002 Aguero .................... B64G 1/54
                                                  244/171.7
(Continued)

FOREIGN PATENT DOCUMENTS

CA    2 205 435    11/1998

OTHER PUBLICATIONS

Extended European Search Report prepared by the European Patent Office in application No. 18 17 7828.3 dated Nov. 13, 2018.

*Primary Examiner* — Thienvu V Tran
*Assistant Examiner* — Nicolas Bellido
(74) *Attorney, Agent, or Firm* — McDonnell Boehnen Hulbert & Berghoff LLP

(57) ABSTRACT

An example lightning strike protection system of an aircraft includes: (i) a capacitor having a predetermined capacity to hold a predetermined quantity of electric charges provided to the capacitor; (ii) a voltage generating device coupled to the capacitor, where as a quantity of electric charges provided to the capacitor exceeds the predetermined capacity of the capacitor, the voltage generating device converts the electric charge stored in the capacitor into a voltage to generate a lightning leader from the aircraft; and (iii) a conductive path embedded in the aircraft to channel a lightning strike induced by a connection of the lightning leader with an oncoming lightning leader therethrough to be discharged away from the aircraft.

20 Claims, 6 Drawing Sheets

(58) Field of Classification Search
CPC .. H01R 43/26; H02H 3/22; H05F 3/00; H05F 3/02; Y02E 10/72
USPC ...... 361/212, 216, 217, 218; 340/601, 693.1
See application file for complete search history.

(56) References Cited

U.S. PATENT DOCUMENTS

| | | | | |
|---|---|---|---|---|
| 7,218,123 | B1 * | 5/2007 | Tsamis | G01R 29/0842 |
| | | | | 324/658 |
| 8,723,694 | B1 * | 5/2014 | Finley | B64D 45/00 |
| | | | | 340/601 |
| 2008/0270052 | A1 * | 10/2008 | Bernus | B64C 1/36 |
| | | | | 702/65 |
| 2019/0135449 | A1 * | 5/2019 | Peres | B64D 45/02 |

* cited by examiner

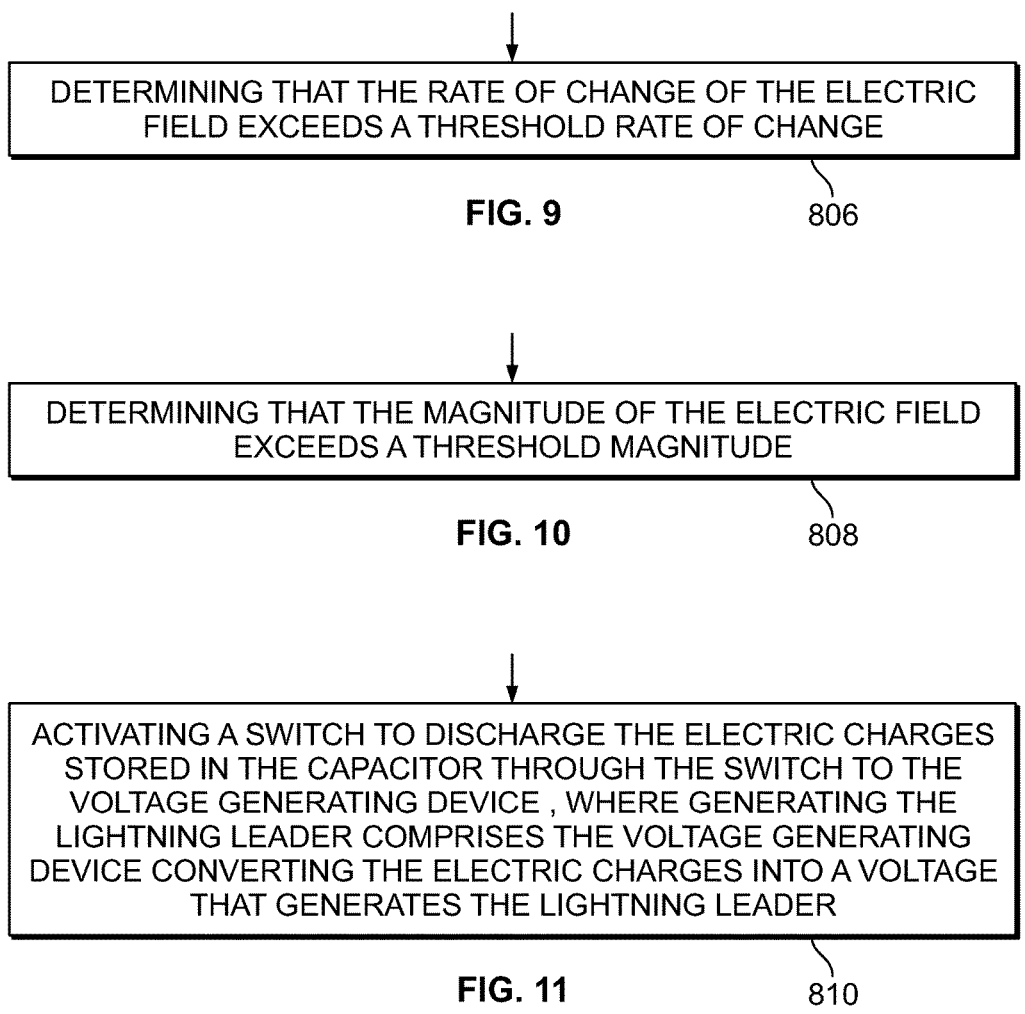

METHODS AND SYSTEMS FOR AIRCRAFT LIGHTNING STRIKE PROTECTION

FIELD

The present disclosure relates generally to protection of an aircraft from a lightning strike.

BACKGROUND

Lightning is a sudden electrostatic discharge that occurs during a thunderstorm. This discharge occurs between electrically charged regions of a cloud (called intra-cloud lightning or IC), between two clouds (CC lightning), or between a cloud and the ground (CG lightning). The charged regions in the atmosphere temporarily equalize themselves through this discharge, which is referred to as a strike if it hits an object on the ground, and referred to as a flash, if it occurs within a cloud.

The main charging area in a thunderstorm occurs in the central part of the storm where air is moving upward rapidly (updraft) and temperatures range from −15 to −25 Celsius. At that central part, the combination of temperature and rapid upward air movement produces a mixture of super-cooled cloud droplets (small water droplets below freezing), small ice crystals, and soft hail (graupel). The updraft carries the super-cooled cloud droplets and very small ice crystals upward. At the same time, the graupel, which is considerably larger and denser, tends to fall or be suspended in the rising air. The differences in the movement of the precipitation cause collisions to occur. When the rising ice crystals collide with graupel (soft hail), the ice crystals become positively charged and the graupel becomes negatively charged.

The updraft carries the positively charged ice crystals upward toward the top of the storm cloud. The larger and denser graupel is either suspended in the middle of the thunderstorm cloud or falls toward the lower part of the storm. As a result, the upper part of the thunderstorm cloud becomes positively charged while the middle to lower part of the thunderstorm cloud becomes negatively charged.

As a thunderstorm cloud moves over the surface of the Earth, an equal electric charge, but of opposite polarity, is induced on the Earth's surface underneath the cloud. The oppositely charged regions create an electric field within the air between them. This electric field varies in relation to the strength of the surface charge on the base of the thundercloud, such that the greater the accumulated charge, the higher the electrical field.

Under some conditions, a channel of ionized air, called a "leader", is initiated from a charged region in the thunderstorm cloud. Leaders are electrically conductive channels of partially ionized gas that travel away from a region of dense charge. Negative leaders propagate away from densely charged regions of negative charge, and positive leaders propagate from positively charged regions. The positively and negatively charged leaders proceed in opposite directions, a positive leader proceeds upwards within the cloud and a negative leader proceeds towards the earth.

When a leader approaches the ground, the presence of opposite charges at points on the ground enhances the strength of the electric field. If the electric field is strong enough, a positively charged ionic channel, called a positive upward leader (also referred to as an upward streamer), can develop from these points.

Once a downward leader connects to an available upward leader, a process referred to as attachment, a low resistance path is formed and discharge may occur. Once a conductive channel bridges the air gap between the negative charge excess in the cloud and the positive surface charge excess below, an electrical discharge follows. This electric discharge may be referred to as a "strike" and it is the luminous and noticeable part of the lightning discharge.

An aircraft flying through a thunderstorm may be struck by a lightning while in flight. There are two kinds of lightning encounters by an aircraft. The first one may be referred to as an intercepted lightning, which occurs when the flight path of the aircraft intercepts a lightning strike that is already in progress. The second and more common type is an aircraft-induced lightning, where the aircraft disrupts the electric field in the atmosphere and initiate an electric spark that may cause a lightning strike on the aircraft. Regardless of the type of strike, the lightning may strike the aircraft anywhere and may affect operation of the aircraft.

In an example, if an aircraft is made of a metal (e.g., aluminum), the skin or outer structure of the aircraft may be made thick so as to enable the aircraft to withstand the strike. In another example, if the skin or outer structure of the aircraft is made of a composite material, the composite material may be embedded with a mesh of a metallic conductor (e.g., a copper mesh). The entire structure may be embedded with such a mesh because the location of a strike could be anywhere on the aircraft.

Making the body of the aircraft from a thick metal or embedding a composite structure with a copper mesh to protect the aircraft from lightning increases the weight of the aircraft. Increasing the weight of the aircraft reduces the fuel efficiency of the aircraft. Therefore, it may be desirable to include a lightning strike protection system in the aircraft that predictably causes any lightning strike to hit the aircraft at a known location and facilitates guiding the strike safely across the aircraft and discharging the strike away from the aircraft.

SUMMARY

The present disclosure describes embodiments that relate to methods and systems for aircraft lightning strike protection.

In one aspect, the present disclosure describes an aircraft lightning strike protection system. The aircraft lightning strike protection system includes: (i) an electric field sensor configured to provide information indicative of a parameter associated with an electric field in a vicinity of an aircraft; (ii) a capacitor configured to store electric charges; (iii) a conductive path coupled to the aircraft; and a processor configured to perform operations. The operations include: (i) receiving, from the electric field sensor, the information indicative of the parameter associated with the electric field in the vicinity of the aircraft, and (ii) based on the information indicating that the parameter meets a threshold value, discharging the capacitor to generate a lightning leader from the aircraft, where a lightning strike to the aircraft caused by a connection of the lightning leader with an oncoming lightning leader is channeled through the conductive path to be discharged away from the aircraft.

In another aspect, the present disclosure describes a method. The method includes: (i) receiving, from an electric field sensor coupled to an aircraft, information indicative of a parameter associated with an electric field in a vicinity of the aircraft, where the aircraft includes (a) a capacitor configured to store electric charges, and (b) a conductive path; (ii) based on the information indicating that the parameter meets a threshold value, discharging the electric charges stored in the capacitor; and (iii) generating, using the electric charges discharged from the capacitor, a lightning leader from the aircraft to induce a lightning strike formed by a connection of the lightning leader with an oncoming lightning leader, where the lightning strike is channeled through the conductive path to be discharged away from the aircraft.

In still another aspect, the present disclosure describes a lightning strike protection system of an aircraft. The lightning strike protection system includes: (i) a capacitor having a predetermined capacity to hold a predetermined quantity of electric charges provided to the capacitor; (ii) a voltage generating device coupled to the capacitor, where as a quantity of electric charges provided to the capacitor exceeds the predetermined capacity of the capacitor, the voltage generating device converts the electric charge stored in the capacitor into a voltage to generate a lightning leader from the aircraft; (iii) a conductive path embedded in the aircraft to channel a lightning strike induced by a connection of the lightning leader with an oncoming lightning leader therethrough to be discharged away from the aircraft.

The foregoing summary is illustrative only and is not intended to be in any way limiting. In addition to the illustrative aspects, embodiments, and features described above, further aspects, embodiments, and features will become apparent by reference to the figures and the following detailed description.

BRIEF DESCRIPTION OF THE FIGURES

The novel features believed characteristic of the illustrative embodiments are set forth in the appended claims. The illustrative embodiments, however, as well as a preferred mode of use, further objectives and descriptions thereof, will best be understood by reference to the following detailed description of an illustrative embodiment of the present disclosure when read in conjunction with the accompanying Figures.

FIG. 9 illustrates is a flowchart of a method for use with the method of FIG. 8, in accordance with an example implementation.

FIG. 10 is a flowchart of a method for use with the method of FIG. 8, in accordance with an example implementation.

FIG. 11 is a flowchart of a method for use with the method of FIG. 8, in accordance with an example implementation.

DETAILED DESCRIPTION

Figure 1:
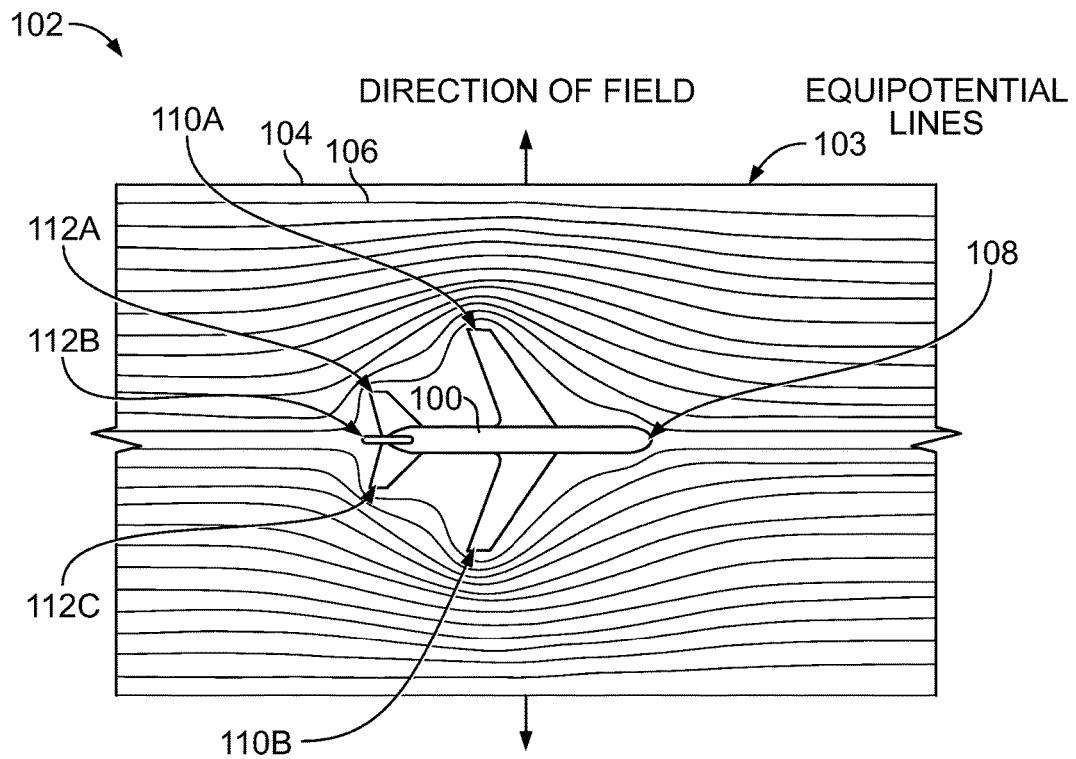
FIG. 1 illustrates an aircraft traversing an area having an electric field, in accordance with an example implementation.

An aircraft-induced lightning strike occurs when an aircraft disrupts an electric field in the atmosphere. FIG. 1 illustrates an aircraft 100 traversing an area having an electric field 102, in accordance with an example implementation. FIG. 1 further illustrates equipotential lines such as lines 104 and 106, which are contour lines of electric potential or voltage. Equipotential lines are perpendicular to the electric field 102.

The structure and materials from which the aircraft 100 is made play a role in initiating a lightning strike. If the structure of the aircraft 100 is made of thick conductor (e.g., metal such as aluminium), then the aircraft 100 may assume the electric potential of its location within the electric field 102.

The aircraft 100 may divert and compress the equipotential lines 103, thus increasing intensity of the electric field 102 in a vicinity of the aircraft 100. Particularly, the intensity of the electric field 102 may increase locally at sharp regions or extremities of the aircraft 100 such as at a nose 108, wing tips 110A and 110B, and tail or empennage tips 112A, 112B, and 112C. The intensity of the electric field 102 may also increase at smaller protrusions, such as antenna probes coupled to the aircraft 100.

Air, as an electric insulator, provides a resistance to, and prevents conducting, an electric current therethrough. However, each insulator has a breakdown voltage value, which is the voltage value that when applied to the insulator causes a reduction in the resistance of the insulator and renders the insulator electrically conductive. As an example, the breakdown value for air near sea level is 30 kilo Volt per centimeter (kV/cm). This breakdown value changes with altitude and with properties of the air such as temperature and humidity. For example, the breakdown value at an altitude of 6 kilometers may be half the breakdown value near sea level.

In examples, the above-mentioned sharp regions (the nose 108, the wing tips 110A-110B, and the empennage tips 112A-112C) of the aircraft 100 may cause the intensity of the electric field 102 to increase to the breakdown value of air at the particular altitude of the aircraft 100. Once the breakdown value is reached, air molecules may be ionized and electrical sparks may thus originate from the sharp regions of the aircraft 100.

Figure 2:
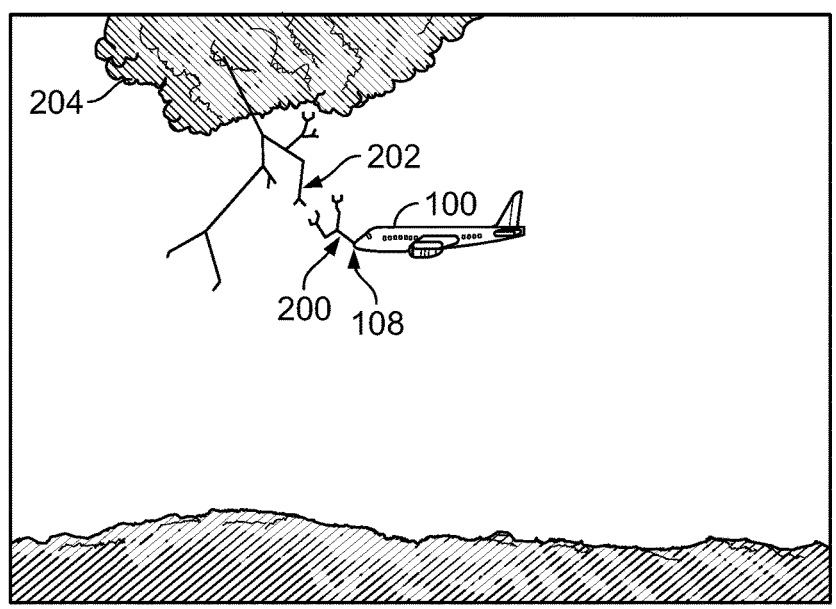
FIG. 2 illustrates formation of an aircraft-induced lightning strike, in accordance with an example implementation.

FIG. 2 illustrates formation of an aircraft-induced lightning strike, in accordance with an example implementation. As an example for illustration, FIG. 2 illustrates the intensity of the electric field 102 increasing at the nose 108 of the aircraft 100 to a value that exceeds the breakdown value, causing formation of electric sparks. The electric sparks may originate on both the sides of the aircraft 100, thus creating bi-directional leaders, which in-turn leads to heavy currents through the structure of the aircraft 100.

Further, an upward leader 200 may form. The leader 200 may attach or connect with an oncoming lightning leader 202 initiated from a cloud 204, thus causing a lightning strike to the aircraft 100. This lightning strike is referred to as an aircraft-initiated lightning strike, and may cause impulsive currents through the structure of the aircraft 100.

Figure 3:
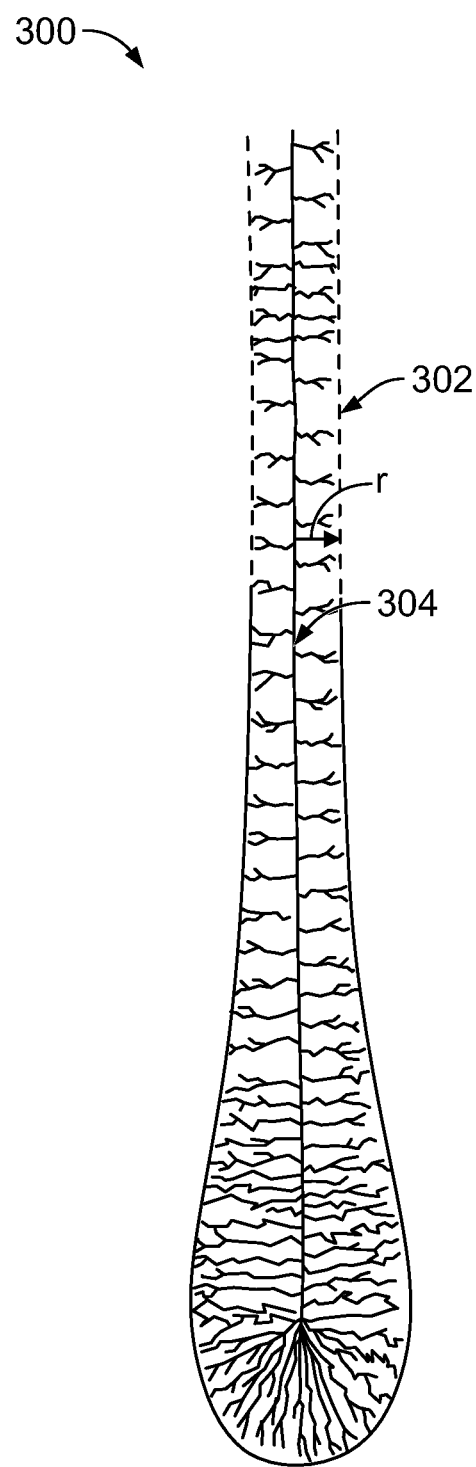
FIG. 3 illustrates an oncoming leader of an intercepted lightning, in accordance with an example implementation.

Another type of lightning that may strike the aircraft 100 is an intercepted lightning, which occurs when the flight path of the aircraft 100 intercepts a lightning strike that is already in progress. FIG. 3 illustrates an oncoming leader 300 of an intercepted lightning, in accordance with an example implementation. A corona discharge is an electrical discharge brought on by the ionization of air surrounding the oncoming leader 300, which operates as a conductor that is electrically charged. The oncoming leader 300 may have a corona sheath 302 and a central filament 304.

The oncoming leader 300 may be characterized by a high electric potential, and thus a radius of an electric field along the oncoming leader 300 may be large. In examples, the oncoming leader 300 may be described as a cylinder (e.g., the corona sheath 302) carrying a charge $q_0$. The electric field (E) can be approximated by the following equation:

$$E = \frac{1.8 \times 10^{10} q_0}{r} \qquad (1)$$

where r is a radius of the cylinder as depicted in FIG. 3.

As an example for illustration, the oncoming leader 300 may be 5 kilo meter long, and may have a stored charge $q_0$ of 1 to 10 Coulomb. Assuming that the breakdown value for air is 30 kV/cm, the radius r of the cylinder can be estimate using equation (1) to be between 1 and 12 meters. At higher altitudes of the aircraft 100, the breakdown value of air is less, and thus the radius r of the oncoming leader 300 is larger.

Regardless of which type of strike hits the aircraft 100, the strike would affect operation of the aircraft 100 due to the electric currents that would flow through the structure of the aircraft 100 or a metallic mesh embedded therein. Disclosed herein are systems and methods to detect that a lightning strike may be about to occur, and initiating a counter strike or counter-leader from a predetermined location or part of the aircraft 100. The counter-leader may connect with an oncoming leader from a thunder cloud to form a lightning strike. The predetermined part of the aircraft 100 is coupled to a conductive path that safely and controllably guides the lightning strike to another part of the aircraft 100, from which the lightning strike is discharged away from the aircraft 100.

With this configuration, a lightning would strike a known predetermined part of the aircraft 100. If the aircraft 100 is made of a metallic structure, then rather than making the entire structure sufficiently thick to endure the lightning strike, the predetermined part of the aircraft 100 may be made thick, while the remaining part of the structure might not be thickened. If the aircraft 100 is made of a composite structure, then rather than embedding a metallic (e.g., copper) mesh throughout the entire structure, a conductive path may connect the predetermined location to a discharging system, and the remaining mesh may be eliminated from the structure of the aircraft 100. As a result, the weight of the aircraft 100 may be reduced, and fuel efficiency may be enhanced.

Figure 4:
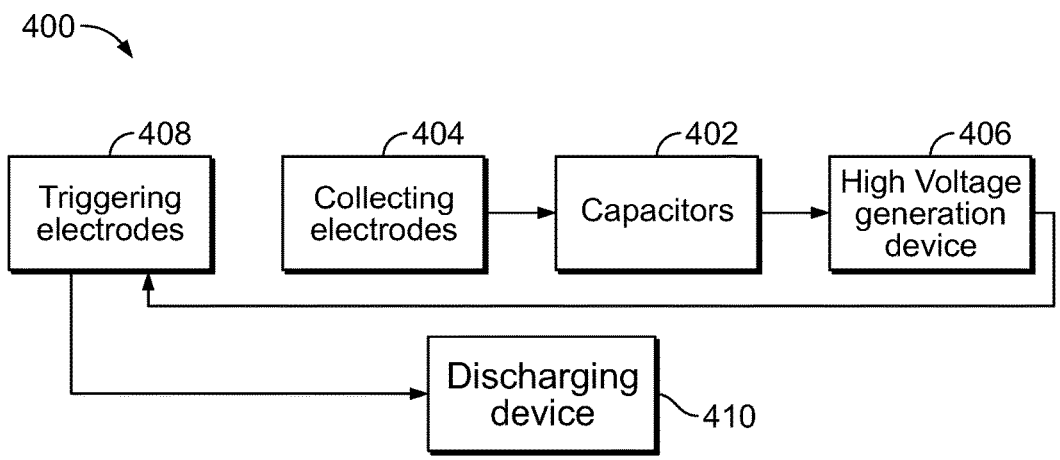
FIG. 4 illustrates a system for lightning strike protection, in accordance with an example implementation.

FIG. 4 illustrates a system 400 for lightning strike protection, in accordance with an example implementation. The system 400 includes capacitors 402 configured to stored electric charges. In some examples, one capacitor may be used.

In an example, the system 400 may include a set (e.g., a pair) of collecting electrodes 404 that are electrically coupled to the capacitors 402. The set of collecting electrodes 404 may be configured to collect electric charges from an ambient environment of the aircraft 100. Particularly, as mentioned above with respect to FIG. 1, the aircraft 100 may be traversing the electric field 102 formed in the vicinity of or around the aircraft 100. The set of collecting electrodes 404 may be configured to attract and collect electric charges from the electric field 102, and communicate the collected electric charges to the capacitors 402 to be stored thereat. In other examples, other sources, such as a battery or a generator, rather than or in addition to the set of collecting electrodes 404 may be used to charge the capacitors 402 with electric charges.

The capacitors 402 may be designed or selected to have a particular capacity to store a particular quantity of electric charges. Upon reaching the particular capacity of the capacitors 402 to store the electric charges, the electric charges stored in the capacitors 402 are discharged from the capacitors and flow to a high voltage generation system or device 406. The high voltage generation device 406 is configured to convert the electric charges received from the capacitors 402 into a high voltage sufficient to generate a counter strike or counter-leader from the aircraft 100.

As an example for illustration, the high voltage generation device 406 may include an inductor or a plurality of inductors. As the electric charges received from the capacitors 402 flow as an electric current through the inductor, the sudden change or the rate of change in electric current through the inductor causes a voltage to be generated or induced across the inductor. Other apparatuses, such as a fly-back transformer or a resonance circuit, could be used to generate a voltage from the electric charges of the capacitors 402.

The high voltage generation device 406 is electrically coupled to a set (e.g., a pair) of triggering electrodes 408 that are kept isolated from the set of collecting electrodes 404. In an example, the set of collecting electrodes 404 and the set of triggering electrodes 408 could be placed at one or more sharp corners or regions of the aircraft 100 where the probability of a lightning strike is increased. As examples, the set of collecting electrodes 404 and the set of triggering electrodes 408 could be placed at the nose 108, the wing tips 110A-110B, and/or the empennage tips 112A-112C).

Figure 5:
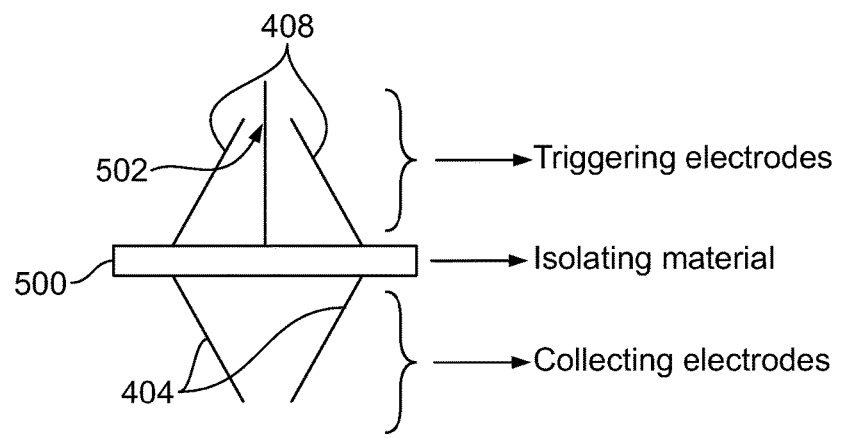
FIG. 5 illustrates a set of triggering electrodes isolated from a set of collecting electrodes, in accordance with an example implementation.

FIG. 5 illustrates the set of triggering electrodes 408 isolated from the set of collecting electrodes 404, in accordance with an example implementation. As shown, an isolating material 500 may be used to electrically insulate the set of triggering electrodes 408 isolated from the set of collecting electrodes 404.

The set of triggering electrodes 408 are electrically coupled to the high voltage generation device 406 such that the voltage generated by the high voltage generation device 406 is generated across the set of triggering electrodes 408. The set of triggering electrodes 408 may be designed with a particular or predetermined spacing 502 therebetween. The spacing 502 may be selected or determined such that when the voltage from the high voltage generation device 406 is applied to the set of triggering electrodes 408, a spark is generated between the set of triggering electrodes 408. The spark generated in the spacing 502 then forms a counter-leader that is discharged from a particular location or part of the aircraft 100 as described below with respect to FIG. 6.

The particular charge capacity of the capacitors 402 is determined based on several factors. For example, the capacity may be based on properties of the air, such as temperature, density, humidity, etc., at a particular altitude. The capacity may also be based on the breakdown value of air at the particular altitude. Determining the capacity of the capacitors 402 may also take into consideration the design and configuration of the set of triggering electrodes 408. For instance, the spacing 502 between the triggering electrodes 408 and sharpness of the triggering electrodes 408 may determine how much electric charge would generate an electric spark therebetween. Thus, based on the above-mentioned factors, the charge capacity of and configuration of the capacitors 402 may be determined.

Figure 6:
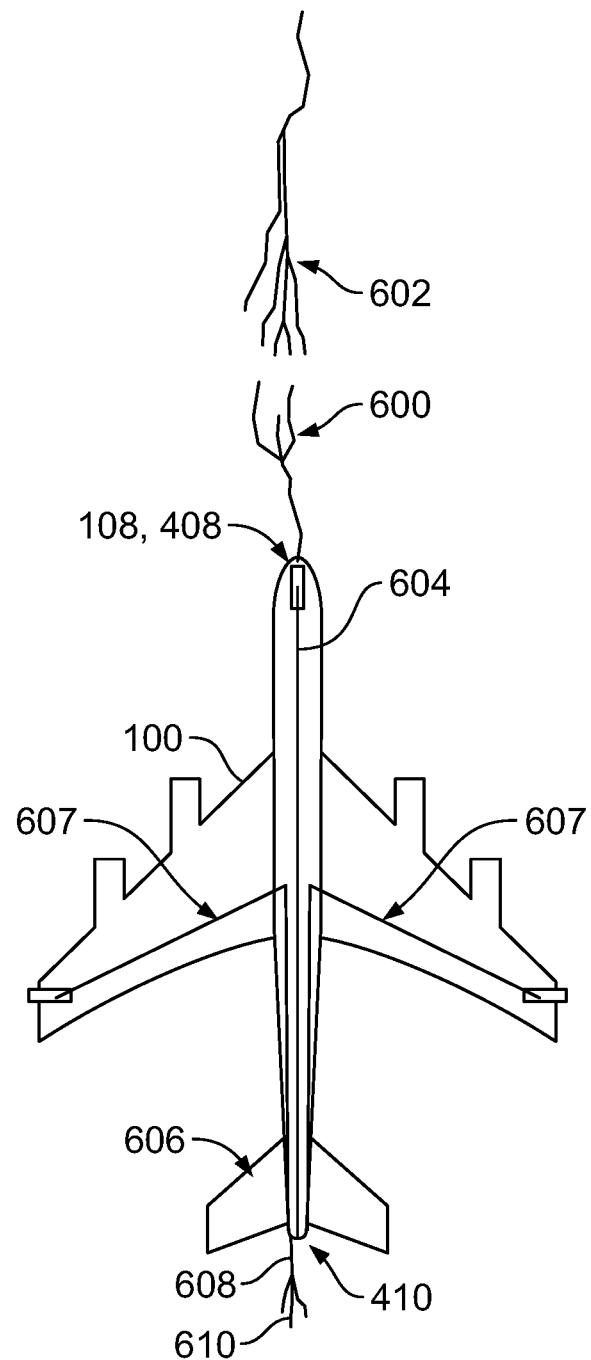
FIG. 6 illustrates a counter-leader generated from a nose of an aircraft, in accordance with an example implementation.

FIG. 6 illustrates a counter-leader 600 generated from the nose 108 of the aircraft 100, in accordance with an example implementation. As an example, FIG. 6 illustrates that the set of triggering electrodes 408 could be located at the nose 108 of the aircraft 100, and the counter-leader 600 is discharged therefrom. However, the set of triggering electrodes 408 could be placed at other parts of the aircraft 100 as well.

The counter-leader 600 may intercept, connect, and attach with an oncoming leader 602 of a lightning and cause or induce a lightning strike to the aircraft 100 at the particular part, e.g., the nose 108, from which the counter-leader 600 has emanated. The aircraft 100 may further include a conductive path 604 that guides the electric current generated by the lightning strike to another part of the aircraft 100.

For instance, the conductive path 604 may include copper strips that connect a first location or part where the lightning strike occurs, e.g., the nose 108, to a second location or part, e.g., a tail 606. This configuration is an example for illustration, and other conductive paths could be implemented. For example, as shown in FIG. 6, in addition or alternative to the copper strips forming the conductive path 604, other copper strips 607 could be embedded in a wing structure of the aircraft 100. As such, the electric current generated by the induced lightning strike could be guided to one or both wing tips of the aircraft 100.

Referring back to FIG. 4, the system 400 may also include a discharging device 410. The voltage provided to the set of triggering electrodes 408 generates the counter-leader 600 to induce a lightning strike, which is then safely guided through the conductive path 604 to the discharging device 410. The discharging device 410 then discharges the lightning strike or the electric charge associated therewith from another location or part of the aircraft 100 away from the aircraft 100.

As shown in FIG. 6 as an example, the discharging device 410 may include one or more discharge wicks 608 that are electrically coupled to the conductive path 604. The discharging device 410 may then fire a leader 610 from the tail 606 of the aircraft 100 to discharge the electric charge of the induced lightning strike into another cloud or into the earth. The leader 610 is thus fired or discharged from a different location than the location where the lightning strike occurs (e.g., at the nose 108).

With this configuration, a lightning strike to the aircraft 100 occurs at a controlled and predetermined location where the counter-leader 600 is discharged. If the aircraft 100 is made of a metallic structure, then rather than making the entire structure sufficiently thick or reinforced to endure the lightning strike, the predetermined part of the aircraft 100 (e.g., the nose 108 in FIG. 6) may be made thick or reinforced, while the remaining part of the structure might not be thickened or reinforced. On the other hand, if the aircraft 100 is made of a composite structure, then rather than embedding a metallic (e.g., copper) mesh throughout the entire structure, a conductive path such as the conductive path 604 is implemented to connect the predetermined part from which the counter-leader 600 is discharged to the discharging device 410, and the remaining mesh may be eliminated from the structure of the aircraft 100. As a result, the weight of the aircraft 100 may be reduced, and fuel efficiency may be enhanced.

In another example, the system 400 may be actively controlled via controller that monitors a parameter associated with the electric field 102 in the vicinity of the aircraft 100. The controller may be configured to cause the capacitors 402 to be discharged and the counter-leader 600 to be fired when the parameter associated with the electric field 102 meets a threshold value.

Figure 7:
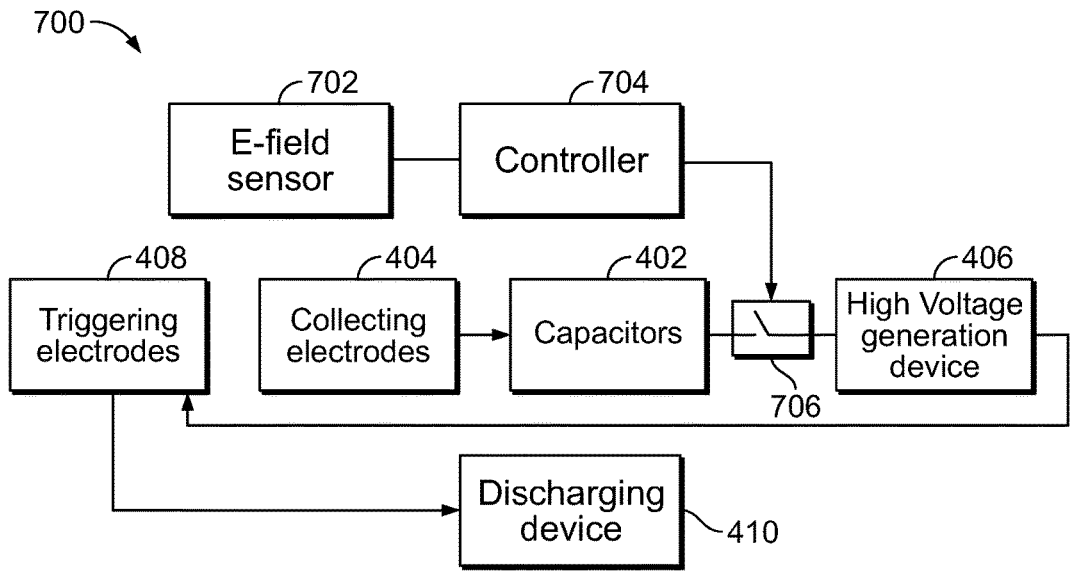
FIG. 7 illustrates a system for lightning strike protection involving monitoring of the electric field in the vicinity of the aircraft, in accordance with an example implementation.

FIG. 7 illustrates a system 700 for lightning strike protection involving monitoring of the electric field 102 in the vicinity of the aircraft, in accordance with an example implementation. The system 700 includes the components of the system 400, and additionally includes an electric field sensor 702 that monitors the electric field 102 in the atmosphere or ambient environment in the vicinity of the aircraft 100.

The system 700 also includes a controller 704 in communication with the electric field sensor 702. The controller 704 may include one or more processors configured to perform operations in response to information received from the electric field sensor 702.

The controller 704 receives from the electric field sensor 702 information indicative of a parameter associated with the electric field 102 in the vicinity of an aircraft 100. When the parameter meets a particular predetermined threshold value, the controller 704 activates or energizes a switch 706 disposed between the capacitors 402 and the high voltage generation device 406. Upon activating the switch 706, the capacitors 402 discharge the electric charge stored therein into the high voltage generation device 406. Then, as described above with respect to FIGS. 4-6, the high voltage generation device 406 is configured to convert the electric charges received from the capacitors 402 into a high voltage sufficient to generate the counter-leader 600 using the set of triggering electrodes 408.

An intercepted lightning is characterized by a large rate of increase in the intensity of the electric field 102. For instance, the intensity may rise fast to reach a particular high intensity value in a short period of time. Thus, in an example, the controller 704 may determine from the information received from the electric field sensor 702 that the rate of change of the intensity of the electric field 102 meets a predetermined threshold rate of change. The term "meets a threshold" is used herein to indicate that the parameter is within a particular value, e.g., equals or is greater or less than the threshold by a particular value or percentage (e.g., 2%) of the threshold.

If the rate of change, e.g., rate of increase, of the intensity of the electric field 102 meets the threshold rate of change, the controller 704 may activate the switch 706 to initiate firing the counter-leader 600 and protect the aircraft 100. The counter-leader 600 may connect with an oncoming leader (e.g., the oncoming leader 602) of an intercepted lightning and induce a lightning strike to the aircraft 100 at the particular part, e.g., the nose 108, from which the counter-leader 600 has emanated. As described above, the aircraft 100 may include the conductive path 604 that guides the electric current generated by the lightning strike to another part of the aircraft 100 at which the discharging device 410 is located. The discharging device 410 may then fire the leader 610 to discharge the electric charge of the induced lightning strike into another cloud or into the earth.

On the other hand, an aircraft-induced lightning is characterized by a slow rate of increase in the intensity of the electric field 102, but the intensity and magnitude of the electric field 102 reach a large value. Thus, in an example, the controller 704 may determine based on the information received from the electric field sensor 702 that the rate of change of the intensity or magnitude of the electric field 102 is low but that the intensity or magnitude of the electric field 102 meets a predetermined threshold intensity or magnitude value (e.g., 30 KV/cm, which can be adjusted based on altitude, temperature, and humidity).

If the intensity or magnitude of the electric field 102 meets the threshold value, the controller 704 may activate the switch 706 to initiate firing the counter-leader 600 and protect the aircraft 100 as described above. Thus, whether the aircraft 100 is about to be struck by an intercepted lightning or an aircraft-induced lightning, the controller 704 may detect the conditions that would lead to either type of lightning and protect the aircraft 100.

Figure 8:
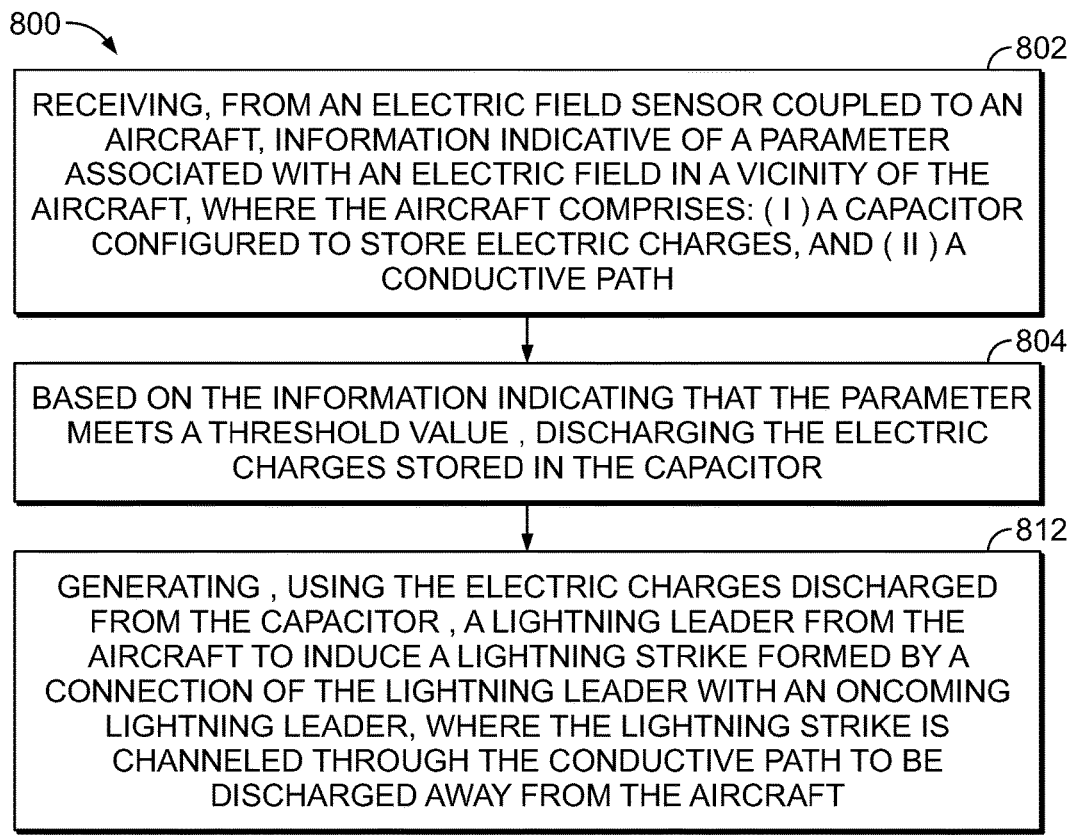
FIG. 8 illustrates is a flowchart of a method for protecting an aircraft from a lightning strike, in accordance with an example implementation.

FIG. 8 is a flowchart of a method 800 for protecting an aircraft from a lightning strike, in accordance with an example implementation. The method 800 could, for example, be performed by the system 700. Further, FIGS. 9-11 are flowcharts of methods for use with the method 800.

The method 800 may include one or more operations, or actions as illustrated by one or more of blocks 802-812. Although the blocks are illustrated in a sequential order, these blocks may in some instances be performed in parallel, and/or in a different order than those described herein. Also, the various blocks may be combined into fewer blocks, divided into additional blocks, and/or removed based upon the desired implementation.

In addition, for the method 800 and other processes and operations disclosed herein, the flowchart shows operation of one possible implementation of present examples. In this regard, each block may represent a module, a segment, or a portion of program code, which includes one or more instructions executable by a processor (e.g., the controller 704) for implementing specific logical operations or steps in the process. The program code may be stored on any type of computer readable medium or memory, for example, such as a storage device including a disk or hard drive. The computer readable medium may include a non-transitory computer readable medium or memory, for example, such as computer-readable media that stores data for short periods of time like register memory, processor cache and Random Access Memory (RAM). The computer readable medium may also include non-transitory media or memory, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, a tangible storage device, or other article of manufacture, for example. In addition, for the method 800 and other processes and operations disclosed herein, one or more blocks in FIGS. 8-11 may represent circuitry or digital logic that is arranged to perform the specific logical operations in the process.

At block 802, the method 800 includes receiving, from an electric field sensor coupled to an aircraft, information indicative of a parameter associated with an electric field in a vicinity of the aircraft. As described above, the aircraft, e.g., the aircraft 100, may include: a capacitor (e.g., the capacitor 402) configured to store electric charges, and (ii) a conductive path, e.g., the conductive path 604.

As described above with respect to FIG. 7, the aircraft 100 may have an electric field sensor 702 coupled thereto. The electric field sensor 702 may be configured to monitor the electric field 102 in the atmosphere in the vicinity of the aircraft 100 and provide information indicative of a parameter associated with the electric field 102. A controller or processor (e.g., the controller 704) may be in communication with the electric field sensor 702 and receives the information indicative of the parameter.

As described above, in an example, the parameter could include the rate of change of the intensity of the electric field 102. In this example, by monitoring the rate of change of the intensity, the controller 704 may be able to detect whether an intercepted lightning could occur. In another example, the parameter could include the intensity or the magnitude of the electric field. In this example, by monitoring the intensity or magnitude of the electric field, the controller 704 may be able to detect whether an aircraft-induced lightning could occur. In examples, the controller or processor may be configured to monitor both the rate of change of the intensity and the intensity or magnitude to predict both types of lightning.

At block 804, the method 800 includes, based on the information indicating that the parameter meets a threshold value, discharging the electric charges stored in the capacitor. The controller 704 may continually monitor the parameter associated with the electric field and compare the parameter to a threshold. If the parameter meets (e.g., exceeds) a threshold, the controller 704 may discharge the capacitors 402.

FIG. 9 is a flowchart of a method for use with the method 800, in accordance with an example implementation. At block 806, the method includes determining that the rate of change of the electric field exceeds a threshold rate of change.

An intercepted lightning is characterized by a large rate of increase in the intensity of electric field 102. Thus, in an example, the controller 704 may determine based on the information received from the electric field sensor 702 that the rate of change of the intensity of the electric field 102 meets a predetermined threshold rate of change. If the rate of change, e.g., rate of increase, of the intensity of the electric field 102 meets the threshold rate of change, the controller 704 may discharge the capacitors.

FIG. 10 is a flowchart of a method for use with the method 800, in accordance with an example implementation. At block 808, the method includes determining that the magnitude of the electric field exceeds a threshold magnitude. An aircraft-induced lightning is characterized by a slow rate of increase in the intensity of electric field 102, but the intensity and magnitude of the electric field 102 reach a large value. Thus, in an example, the controller 704 may determine from the information received from the electric field sensor 702 that the rate of change of the intensity or magnitude of the electric field 102 is low but that the intensity or magnitude of the electric field 102 meets a predetermined threshold value. In response, the controller 704 may discharge the capacitor 402.

In examples, the aircraft lightning protection system may include a switch, e.g., the switch 706, that is electrically coupled to the capacitor 402. FIG. 11 is a flowchart of a method for use with the method 800, in accordance with an example implementation. At block 810, the method includes activating the switch to discharge the electric charges stored in the capacitor through the switch. The electric charges can then be used to generate a voltage via a voltage generating device (e.g., the voltage generating device 406).

Referring back to FIG. 8, at block 812, the method 800 includes generating, using the electric charges discharged from the capacitor, a lightning leader from the aircraft to induce a lightning strike formed by a connection of the lightning leader with an oncoming lightning leader, where the lightning strike is channeled through the conductive path to be discharged away from the aircraft. If the parameter meets the predetermined threshold, the controller 704 discharges the capacitor 402 by, for example, activating the switch 706. A voltage generating device (e.g., an inductor) may be coupled to the switch, such that as electric current flows through the voltage generating device as a result of activating the switch 706, a voltage is generated.

The voltage can then be used to generate a counter-leader (e.g., the counter-leader 600) from the aircraft 100 via, for example, a set of triggering electrodes. The counter-leader 600 may connect with an oncoming leader (e.g., the oncoming leader 602) and induce a lightning strike to the aircraft 100 at the particular part, e.g., the nose 108, from which the counter-leader 600 has emanated. As described above, the aircraft 100 may include the conductive path 604 that guides the electric current generated by the lightning strike to another part of the aircraft 100 at which the discharging device 410 is located. The discharging device 410 may then fire the leader 610 to discharge the electric charge of the induced lightning strike away from the aircraft 100 into another cloud or into the earth.

The detailed description above describes various features and operations of the disclosed systems with reference to the accompanying figures. The illustrative implementations described herein are not meant to be limiting. Certain aspects of the disclosed systems can be arranged and combined in a wide variety of different configurations, all of which are contemplated herein.

Further, unless context suggests otherwise, the features illustrated in each of the figures may be used in combination with one another. Thus, the figures should be generally viewed as component aspects of one or more overall implementations, with the understanding that not all illustrated features are necessary for each implementation.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

Further, devices or systems may be used or configured to perform functions presented in the figures. In some instances, components of the devices and/or systems may be configured to perform the functions such that the components are actually configured and structured (with hardware and/or software) to enable such performance. In other examples, components of the devices and/or systems may be arranged to be adapted to, capable of, or suited for performing the functions, such as when operated in a specific manner.

By the term "substantially" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide The arrangements described herein are for purposes of example only. As such, those skilled in the art will appreciate that other arrangements and other elements (e.g., machines, interfaces, operations, orders, and groupings of operations, etc.) can be used instead, and some elements may be omitted altogether according to the desired results. Further, many of the elements that are described are functional entities that may be implemented as discrete or distributed components or in conjunction with other components, in any suitable combination and location.

While various aspects and implementations have been disclosed herein, other aspects and implementations will be apparent to those skilled in the art. The various aspects and implementations disclosed herein are for purposes of illustration and are not intended to be limiting, with the true scope being indicated by the following claims, along with the full scope of equivalents to which such claims are entitled. Also, the terminology used herein is for the purpose of describing particular implementations only, and is not intended to be limiting.

What is claimed is:

1. An aircraft lightning strike protection system comprising:
    an electric field sensor configured to provide information indicative of a parameter associated with an electric field in a vicinity of an aircraft;
    a capacitor configured to store electric charges;
    a conductive path coupled to the aircraft; and
    a processor configured to perform operations comprising:
        receiving, from the electric field sensor, the information indicative of the parameter associated with the electric field in the vicinity of the aircraft,
        based on the information indicating that the parameter meets a threshold value, discharging the capacitor to generate a lightning leader from the aircraft, wherein a lightning strike to the aircraft caused by a connection of the lightning leader with an oncoming lightning leader is channeled through the conductive path to be discharged away from the aircraft.

2. The aircraft lightning strike protection system of claim 1, further comprising:
    a set of collecting electrodes coupled to the capacitor, wherein the set of collecting electrodes is configured to collect the electric charges from an ambient environment of the aircraft to be stored in the capacitor.

3. The aircraft lightning strike protection system of claim 1, further comprising:
    a voltage generating device coupled to the capacitor, wherein the voltage generating device is configured to convert the electric charges stored in the capacitor into a voltage that generates the lightning leader from the aircraft.

4. The aircraft lightning strike protection system of claim 3, further comprising:
    a set of triggering electrodes coupled to the voltage generating device, wherein the voltage generated by the voltage generating device is generated across the set of triggering electrodes to generate the lightning leader from the aircraft.

5. The aircraft lightning strike protection system of claim 1, further comprising:
    a discharge wick coupled to the conductive path, wherein the discharge wick is configured to discharge the lightning strike away from the aircraft.

6. The aircraft lightning strike protection system of claim 1, wherein the lightning leader is generated from a first part of the aircraft, and wherein the lightning strike channeled through the conductive path is discharged from a second part of the aircraft different from the first part.

7. The aircraft lightning strike protection system of claim 1, further comprising:
    a switch coupled to the capacitor; and
    a voltage generating device, wherein discharging the capacitor to generate the lightning leader comprises:
        activating the switch to discharge the electric charges stored in the capacitor through the switch to the voltage generating device to generate a voltage that generates the lightning leader.

8. The aircraft lightning strike protection system of claim 1, wherein the parameter comprises a rate of change of the electric field in the vicinity of the aircraft versus time, and wherein discharging the capacitor to generate the lightning leader is based on the rate of change exceeding a threshold rate of change.

9. The aircraft lightning strike protection system of claim 1, wherein the parameter comprises a magnitude of the electric field in the vicinity of the aircraft, and wherein discharging the capacitor to generate the lightning leader is based on the magnitude of the electric field exceeding a threshold magnitude.

10. A method comprising
receiving, from an electric field sensor coupled to an aircraft, information indicative of a parameter associated with an electric field in a vicinity of the aircraft, wherein the aircraft comprises: (i) a capacitor configured to store electric charges, and (ii) a conductive path;
based on the information indicating that the parameter meets a threshold value, discharging the electric charges stored in the capacitor; and
generating, using the electric charges discharged from the capacitor, a lightning leader from the aircraft to induce a lightning strike formed by a connection of the lightning leader with an oncoming lightning leader, wherein the lightning strike is channeled through the conductive path to be discharged away from the aircraft.

11. The method of claim 10, wherein the aircraft further comprises a switch coupled to the capacitor and a voltage generating device, wherein discharging the electric charges stored in the capacitor comprises:
activating the switch to discharge the electric charges stored in the capacitor through the switch to the voltage generating device, wherein generating the lightning leader comprises the voltage generating device converting the electric charges into a voltage that generates the lightning leader.

12. The method of claim 10, wherein the parameter comprises a rate of change of the electric field in the vicinity of the aircraft versus time, and wherein discharging the electric charges stored in the capacitor comprises:
determining that the rate of change of the electric field exceeds a threshold rate of change.

13. The method of claim 10, wherein the parameter comprises a magnitude of the electric field in the vicinity of the aircraft, and wherein discharging the electric charges stored in the capacitor comprises:
determining that the magnitude of the electric field exceeds a threshold magnitude.

14. A lightning strike protection system of an aircraft, the lightning strike protection system comprising:
a capacitor having a predetermined capacity to hold a predetermined quantity of electric charges provided to the capacitor;
a voltage generating device coupled to the capacitor, wherein as a quantity of electric charges provided to the capacitor exceeds the predetermined capacity of the capacitor, the voltage generating device converts the electric charges stored in the capacitor into a voltage to generate a lightning leader from the aircraft; and
a conductive path embedded in the aircraft to channel a lightning strike induced by a connection of the lightning leader with an oncoming lightning leader therethrough to be discharged away from the aircraft.

15. The lightning strike protection system of claim 14, further comprising:
a set of collecting electrodes that collect electric charges from an ambient environment of the aircraft, wherein the capacitor is configured to store the electric charges collected by the set of collecting electrodes.

16. The lightning strike protection system of claim 14, further comprising:
a set of triggering electrodes coupled to the voltage generating device, wherein the voltage is generated by the voltage generating device across the set of triggering electrodes to generate the lightning leader.

17. The lightning strike protection system of claim 14, further comprising:
a discharging device coupled to the conductive path to discharge the lightning strike channeled through the conductive path to an ambient environment of the aircraft.

18. The lightning strike protection system of claim 17, wherein the discharging device comprises:
a discharge wick coupled to the conductive path, wherein the discharge wick is configured to discharge the lightning strike away from the aircraft.

19. The lightning strike protection system of claim 14, wherein the lightning leader is generated from a first part of the aircraft, and wherein the lightning strike is discharged away from the aircraft from a second part of the aircraft different from the first part.

20. The lightning strike protection system of claim 14, wherein the conductive path comprises a copper strip embedded in the aircraft and extending from a first location from which the lightning leader is generated to a second location where the lightning strike is discharged away from the aircraft.

* * * * *